US007222314B1

(12) United States Patent
Miller et al.

(10) Patent No.: US 7,222,314 B1
(45) Date of Patent: May 22, 2007

(54) GENERATION OF A HARDWARE INTERFACE FOR A SOFTWARE PROCEDURE

(75) Inventors: Ian D. Miller, Charlotte, NC (US); Jonathan C. Harris, Ellicott City, MD (US); Stephen G. Edwards, Woodbine, MD (US)

(73) Assignee: Xilinx, Inc., San Jose, CA (US)

( * ) Notice: Subject to any disclaimer, the term of this patent is extended or adjusted under 35 U.S.C. 154(b) by 244 days.

(21) Appl. No.: 11/008,849

(22) Filed: Dec. 9, 2004

(51) Int. Cl.
*G06F 17/50* (2006.01)
(52) U.S. Cl. ............................................. 716/3; 716/1
(58) Field of Classification Search .................... 716/1, 716/3–5
See application file for complete search history.

(56) References Cited

U.S. PATENT DOCUMENTS

| 5,347,654 | A | 9/1994 | Sabot et al. |
| 6,904,577 | B2 * | 6/2005 | Schubert et al. ................ 716/4 |
| 6,952,817 | B1 * | 10/2005 | Harris et al. .................... 716/18 |
| 7,111,274 | B1 * | 9/2006 | Edwards et al. ............... 716/18 |
| 2003/0131325 | A1 * | 7/2003 | Schubert et al. ................ 716/4 |

OTHER PUBLICATIONS

Heidi Ziegler et al.; "Coarse-Grain Pipelining on Multiple FPGA Architectures"; Proceedings of the 10th Annual IEEE Symposium on Field-Programmable Custom Computing Machines (FCCM.02); Copyright 2002 IEEE; pp. 1-10.

Donald Soderman; "Implementing C Designs in Hardware:"; ASIC Design & Marketing; Portions Presented at DesignCon98, 1998 International Verilog Conference & 1998 FPGA Configurable Computing Machine Conference; Copyright 1997-1998; pp. 1-12.

Donald Soderman et al.; "Implementing C Designs in Hardware: A Full-Featured ANSI C to RTL Verilog Compiler in Action"; Copyright 1998 IEEE; pp. 23-29.

Manev Luthra et al.; "Interface Synthesis Using Memory Mapping for an FPGA Platform"; CECS Technical Report #03-20; Center for Embedded Computer Systems; Jun. 2003; pp. 1-20.

Xilinx, Inc.; "MicroBlaze Processor Reference Guide"; Embedded Development Kit EDK 8.2i; UG081 (v6.0); Jun. 1, 2006; pp. 42, 54-55, 106, and 126.

* cited by examiner

*Primary Examiner*—Jack Chiang
*Assistant Examiner*—Binh Tat
(74) *Attorney, Agent, or Firm*—LeRoy D. Maunu

(57) ABSTRACT

Generation of a hardware interface specification for a software procedure. In one embodiment, an HDL description is generated for a first memory, at least one first state machine, a second memory, at least one second state machine, and an activation signal. The first memory stores input data corresponding to a plurality of data values consumed by the software procedure. The first state machine receives the input data and stores the input data in the first memory, and at least one of the at least one first state machines receives a plurality of the data values. The second memory stores output data corresponding to at least one data value produced by the software procedure. The second state machine reads the output data from the second memory and sends the output data.

19 Claims, 6 Drawing Sheets

GENERATION OF A HARDWARE INTERFACE FOR A SOFTWARE PROCEDURE

FIELD OF THE INVENTION

The present invention generally relates to generating a hardware description language (HDL) specification of a hardware interface for a software procedure specified in a high-level language (HLL).

BACKGROUND

One approach taken in improving the tools that aid in the design of electronic systems is to provide the designer with the ability to specify parts of the design in a high-level language (HLL). An HLL is a programming language, for example, C, C++, or Java, and with the HLL the designer can specify functionality at a high level of abstraction. A tool, such as the Forge compiler from Xilinx, translates an HLL-specified function to a specification in a hardware description language (HDL). The HDL specification can then be processed using synthesis and place-and-route tools.

In some applications it may be desired to compile only a portion of an HLL program into an HDL specification, leaving the remaining HLL specification to execute on a processor coupled to the compiled portion. This may be done for purposes of accelerating performance of that function of the program. In order to implement in hardware a particular function within an HLL program, the HDL specification of that function must have an interface that is consistent with the input and output requirements, including parameters and state variables, of the HLL function. At least two different approaches may be used to generate the HDL specification of the interface.

In one approach, the designer includes in the HLL source code, specific constructs for implementing the interface. In another approach, compiler-specific libraries are linked into the application source, and the library routines facilitate data movement into and out of the function. Both approaches impose certain restrictions on the designer.

In using interface-specific constructs in an HLL the source code becomes non-standard, which makes establishing a suitable test environment more difficult. Use of the interface-specific constructs may require a customized, proprietary compiler for both hardware generation as well as algorithm verification, testing, and debugging. This may limit the designer's options in selecting development tools.

When compiler-specific libraries are used in an HLL to specify an interface, test data may be required to be applied to the design, test results captured, and test results validated, all via the linked library elements. Thus, both the interface-specific constructs and special library elements complicate the design process by imposing further restrictions on the designer.

The present invention may address one or more of the above issues.

SUMMARY OF THE INVENTION

The various embodiments of the invention include a method for generating a hardware interface specification for a software procedure. In one embodiment, an HDL description is generated for a first memory, at least one first state machine, a second memory, at least one second state machine, and an activation signal. The first memory stores input data corresponding to a plurality of data values consumed by the software procedure. The first state machine receives the input data and stores the input data in the first memory, and at least one of the first state machines receives a plurality of the data values. The second memory stores output data corresponding to at least one data value produced by the software procedure. The second state machine reads the output data from the second memory and sends the output data. The activation signal is activated in response to a corresponding at least one first signal from the first state machine. The first signal indicates availability of the input data in the first memory.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

In an example embodiment of the invention, software tools analyze a software procedure, specified in an HLL, which has been selected for implementation in hardware. Based on the analysis, the software tools may automatically generate a hardware engine to implement the data processing performed by the software procedure, and may also automatically generate a hardware interface, specified in an HDL, to communicate data values consumed and produced by the hardware engine.

In another example embodiment of the invention, detailed analysis by the software tools of data usage by the software procedure may reduce the number of data values that are communicated via the hardware interface.

Figure 1:
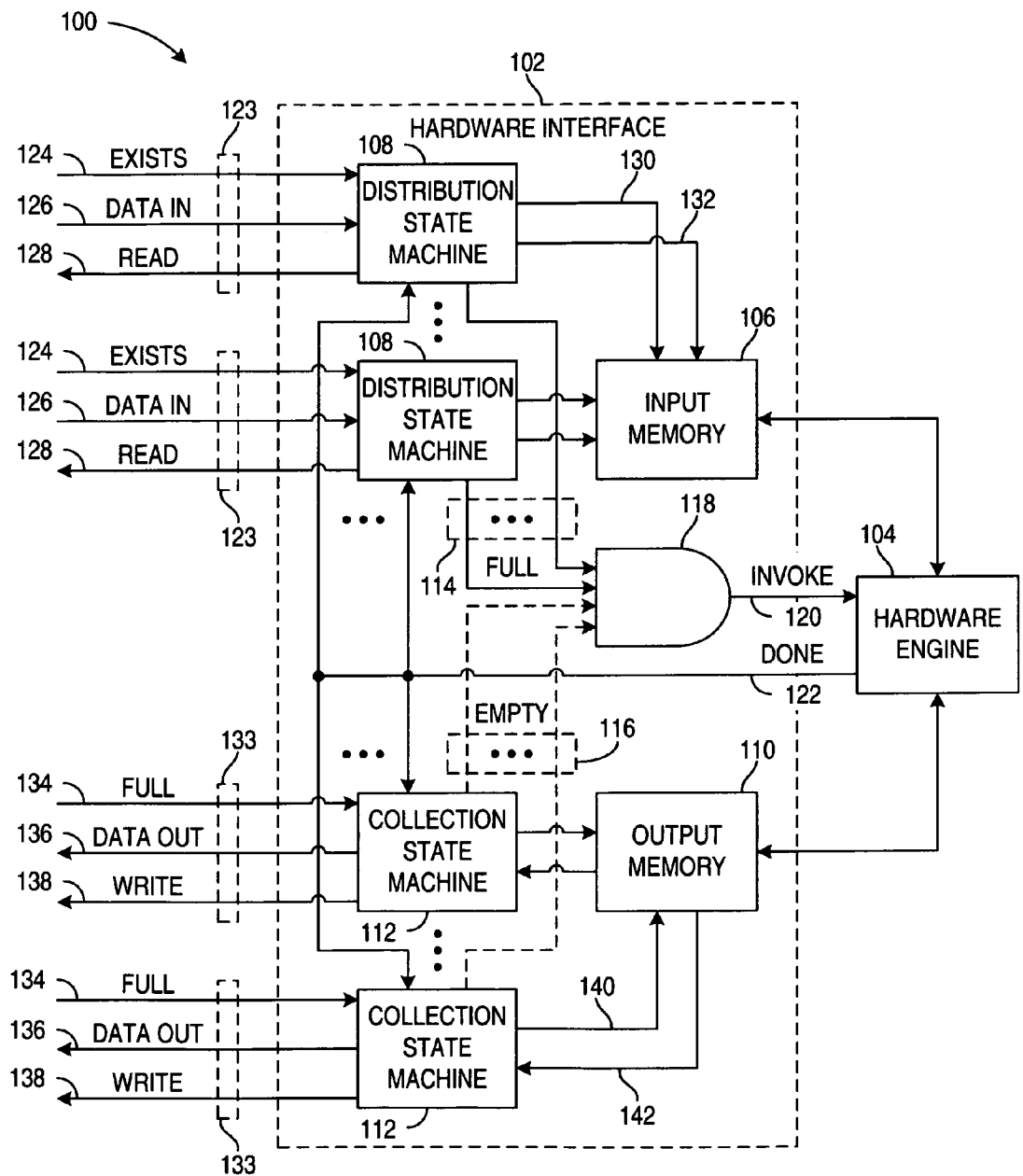
FIG. 1 is a block diagram illustrating an example hardware interface for a hardware implementation of a software procedure, according to various embodiments of the invention.

FIG. 1 is a block diagram illustrating an example hardware interface 102 for a hardware implementation 100 of a software procedure, according to various embodiments of the invention. The hardware implementation 100 of the software procedure is generated from an analysis of the software procedure, which is specified in an HLL. The data processing from the software procedure is implemented by the hardware engine 104 and the data values consumed and generated by the software procedure are communicated with the hardware engine 104 by the hardware interface 102, which is generated in an HDL.

The data values consumed by the hardware engine 104 are distributed in the input memory 106 by one or more distribution state machines 108. The data values produced by the hardware engine 104 and stored in output memory 110 are collected by one or more collection state machines 112. The distribution state machines 108 collectively indicate with respective full signals on lines 114 that all data values consumed by the hardware engine 104 are available in input memory 106. The collection state machines 112 collectively indicate with respective empty signals on lines 116 that space is available in output memory 110 for all data values produced by the hardware engine 104.

When all consumed data values are available in input memory 106 and space is available in output memory 110 for all produced data values, AND function 118 generates an asserted invoke signal on line 120, which causes hardware engine 104 to read the consumed data values from input memory 106, perform the data processing, and write the produced data values to output memory 110. It is recognized that due to different numbers of data elements being processed by each state machine 108 and 112, and due to potential differing rates of processing by each state machine 108 and 112 that the inputs to AND function 118 may arrive in different clock cycles. The AND function 118 provides the capacity to detect when each input on lines 114 and 116 has been asserted at least once before asserting its output as true. On asserting its output as true, it is necessary for each input on lines 114 and 116 to be asserted at least once again before AND function 118 will again assert a true output. After completing data processing and writing all produced data values to output memory 110, the hardware engine 104 asserts the done signal on line 122.

In an alternative embodiment, input memory 106 is divided into multiple logical buffers. Each logical buffer contains sufficient allocated space for at least one complete set of consumed data values. The distribution state machine 108 contains additional logic to select the next available buffer of input memory 106 in which to place the data values consumed by the next invocation of the hardware engine 104. Once complete, the full signal on line 114 is asserted as previously discussed. After assertion of the full signal on line 114, the distribution state machine 108 restarts (prior to completion of the hardware engine 104), filling the next available buffer in input memory 106 with consumed values for a subsequent invocation of the hardware engine. Each invocation of hardware engine 104 is accomplished by receipt of one full signal on line 114 from each distribution state machine 108. Additionally, the hardware engine 104 may be given a logical identifier (e.g. base address) for the buffer from which to take consumed values. A buffer is considered to be available for the distribution state machine 108 to fill with a subsequent data set after reception of the done signal 122 corresponding to the invocation of the hardware engine 104 with the specified buffer.

Similar to the multiple buffers in the input memory 106, the output memory 110 may also be divided into multiple logical buffers, each capable of storing at least one full set of produced values. Each invocation of the hardware engine 104 is supplied with a base address in the output memory 110 of the buffer in which to store the produced data values. The collection state machine 112 operates by reading values from the specified buffer. The hardware engine 104 may be invoked with a subsequent data set before the collection state machine 112 has completed processing.

In an alternative embodiment, done signal 122 may be generated prior to the completion of all logic in hardware engine 104, but after the completion of the last access to the input memory 106. In this manner the distribution state machine 108 may begin filling input memory 106 with the next data set while the hardware engine 104 is completing processing of the current data set.

Each distribution state machine 108 has an input external interface 123 including an "exists" signal input on line 124, a "data-in" input bus on line 126, and a "read" signal output on line 128. An asserted exists signal on line 124 indicates a valid value is available on the data-in bus on line 126. To accept the valid value on line 126, a distribution state machine 108 asserts the read signal on line 128. The assertion of the read signal on line 128 causes the exists signal on line 124 to be de-asserted until a new valid value is available on data-in bus on line 126. Collectively, these signals on lines 124, 126, and 128 implement an interface that is compliant with, and may be directly connected to, the "read" side of an external first-in-first-out (FIFO) memory. Alternatively, these signals on lines 124, 126, and 128 may be connected to any communication channel implementing a matching compliant interface.

An asserted done signal on line 122 indicates to each distribution state machine 108 that the data in input memory 106 has been processed by the hardware engine 104. Collectively the distribution state machines 108 prepare for a subsequent invocation of the hardware engine 104 by proactively obtaining the data values consumed by the subsequent invocation of the hardware engine 104 and storing these data values in the input memory 106. Each distribution state machine 108 is assigned a subset of the consumed data values. On receiving an asserted done signal on line 122, each distribution state machine 108 proactively obtains one or more assigned data values from the corresponding input external interface 123. Typically, at least one distribution state machine 108 obtains a plurality of data values from the corresponding input external interface 123.

The data values consumed by the hardware engine 104 include certain input parameters and certain state variables of the associated software procedure that is implemented by hardware implementation 100. The various data values consumed by the hardware engine 104 may have various data widths. A particular data value may have a width that is less than, equal to, or greater than the bus width of the data-in bus on line 126. Multiple transfers are required to transfer each data value with a width that is greater than the bus width of line 126. Multiple transfers may be used to transfer complex data types, such as structures or arrays, via the data-in bus on line 126. Each data value may be aligned to the bus width of line 126. Thus, a single transfer may be required for each data value with a width that is less than or equal to the bus width of line 126. Alternatively, if there are multiple data values with a width that is less than the bus width of line 126, these values may be packed together into a single transfer with the data being organized in a fashion agreed upon by both the processor and the distribution state machine 108.

Each consumed data value is assigned one or more locations in input memory 106. A location in input memory 106 may contain one data value or a portion of one data value. Each distribution state machine 108 tracks the data values received, and provides data bus 132 and address bus 130, according to the assigned location, to input memory 106. When all data values assigned to a distribution state machine 108 have been received and distributed to the proper locations in input memory 106, a distribution state machine 108 asserts a full signal on a line 114 and suspends obtaining data values consumed until the next assertion of done on line 122.

Each collection state machine 112 has an output external interface 133 including a "full" input on line 134, a "data-out" output bus on line 136, and a "write" output on line 138. An asserted "full" signal on line 134 indicates that the output external interface 133 temporarily cannot accept values from the data-out bus on line 136. To send a valid value on line 136, a collection state machine 112 asserts the "write" signal on line 138. The assertion of the "write" signal on line 138 causes the valid value on line 136 to be accepted by the output external interface 133, and causes the "full" signal on line 134 to be asserted if the output external interface 133 cannot accept additional values from the data-out bus on line 136. Collectively these signals on lines 134, 136, and 138 are compliant with, and may be directly connected to, the write interface of an external FIFO memory. Alternatively, these signals on line 134, 136, and 138 may be connected to any communication channel implementing a matching compliant interface.

An asserted done signal on line 122 indicates to each collection state machine 112 that the produced data values from hardware engine 104 are available in output memory 110. Collectively the collection state machines 112 prepare for a subsequent invocation of the hardware engine 104 by proactively unloading the output memory 110. Each collection state machine 112 is assigned a subset of the produced data values. On receiving an asserted done signal on line 122, each collection state machine 112 proactively transfers one or more assigned data values to the corresponding output external interface 133. Typically, at least one collection state machine 112 transfers a plurality of data values to the corresponding output external interface 133.

The various data values produced by the hardware engine 104 may have various data widths and each produced data value may be aligned to the bus width of line 136. A produced data value may require multiple transfers on the data-out bus on line 136 or multiple produced data values may be packed into a single transfer on line 136. Each produced data value is assigned one or more locations in output memory 110. A location in output memory 110 may contain one data value or a portion of one data value. Each collection state machine 112 tracks the data values transferred and provides address bus 140, according to the assigned location, to output memory 110. Each collection state machine 112 receives values from output memory 110 on data bus 142. When all data values assigned to a collection state machine 112 have been collected from the proper locations in output memory 110 and transferred to the corresponding output external interface 133, a collection state machine 112 asserts an empty signal on a line 116 and suspends transferring produced data values until the next assertion of done on line 122.

In certain embodiments, the invoke signal on line 120 is a time independent AND function (similar to AND 118) of only the full signals on lines 114 and is independent of the empty signals on lines 116, as is later discussed in detail in connection with FIG. 4.

Figure 2:
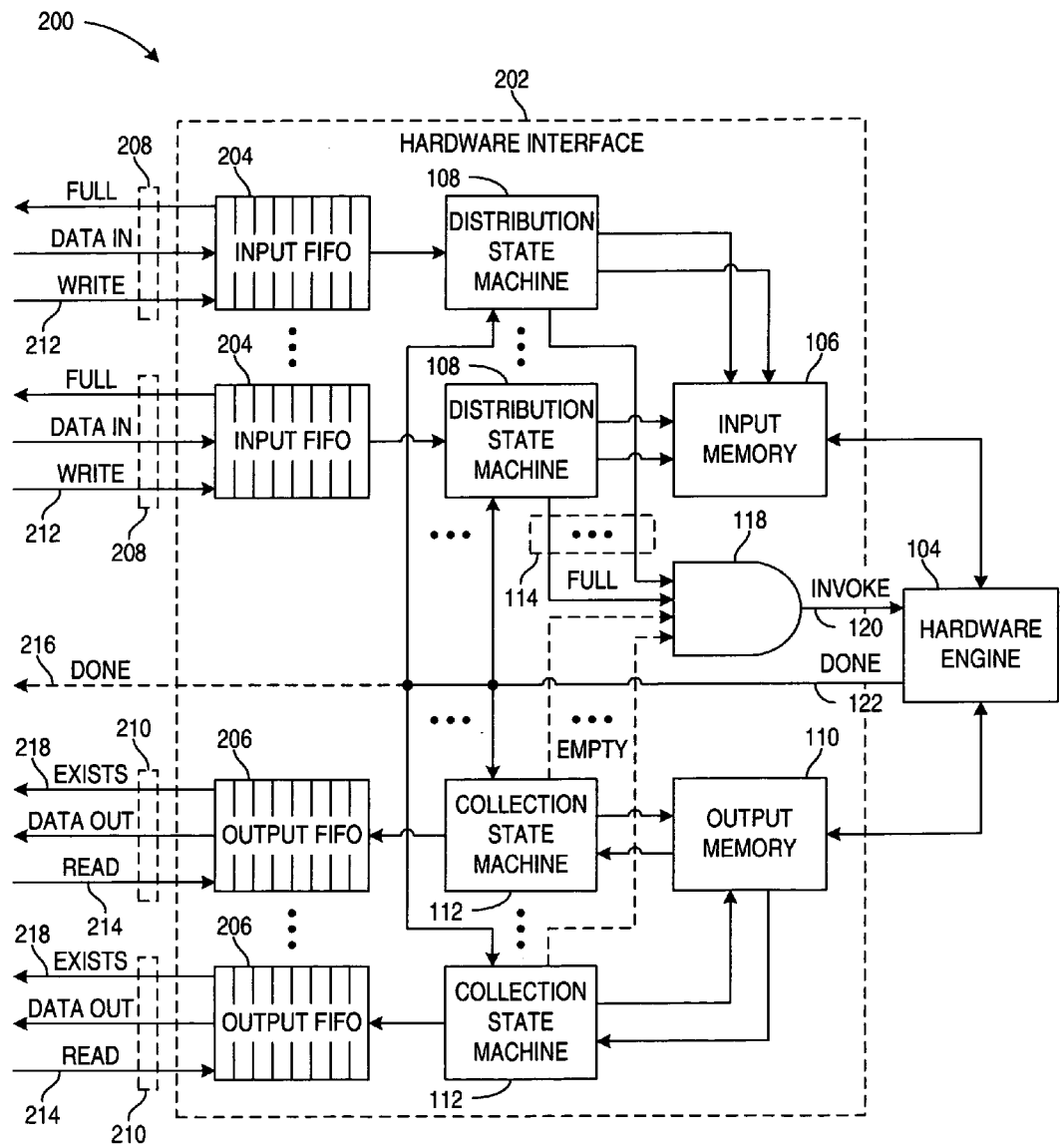
FIG. 2 is a block diagram illustrating an example hardware interface including FIFO buffers for a hardware implementation of a software procedure, according to various embodiments of the invention.

FIG. 2 is a block diagram illustrating an example hardware interface 202 including FIFO buffers for a hardware implementation 200 of a software procedure, according to various embodiments of the invention. Each distribution state machine 108 has a respective input FIFO buffer 204, and each collection state machine 112 has a respective output FIFO buffer 206.

The FIFO buffers 204 and 206 decouple each corresponding external interface 208 and 210 from the hardware engine 104. The depth of each FIFO 204 and 206 may be determined by certain factors, such as the data transfer bandwidths of the external interfaces 208 and 210 and the hardware engine 104, the degree of contention at the external interfaces 208 and 210, and the level of decoupling desired. Depending on the certain factors, an input FIFO 204 may have a depth of a single location or may have a depth sufficient to buffer data values consumed by one or more invocations of the hardware engine 104. Similarly, an output FIFO 206 may have a depth of a single location or may have a depth sufficient to buffer data values produced by one or more invocations of the hardware engine 104. Additionally, one or more FIFO buffers 204 and 206 may be eliminated with the elimination of all FIFO buffers 204 and 206 resulting in hardware interface 202 that is similar to hardware interface 102 of FIG. 1, with the notable difference that the direction of the interface has been reversed as discussed in the next paragraph.

The external interfaces 208 and 210 are reactive interfaces, with the transfer control signals (the write signal on line 212 and the read signal on line 214) being externally driven. The reactive external interfaces 208 and 210 may also be described as passive or slave interfaces. In contrast, the external interfaces 123 and 133 of FIG. 1 are proactive with the transfer control signals read on line 128 and write on line 138 being internally generated by hardware interface 102. The external interfaces 123 and 133 of FIG. 1 may also be described as an active or a master interface.

The input memory 106 and output memory 110 provide decoupling for the ordering of data value accesses. The order of accesses by the hardware engine 104 may be determined by the data processing performed by the hardware engine 104. A specific hardware engine 104 may repeatedly access a particular data valid, for example, repeatedly reading a data value consumed from the input memory 106 or repeatedly writing a data value produced to the output memory 110. A certain specific hardware engine 104 may possibly write values for a consumed data value in the input memory 106 or read values for a produced data value in the output memory 110. In one embodiment of the invention, input memory 106 and output memory 110 may share the same physical memory implementation, potentially overlapping in all their locations.

Generally, each consumed data value is transferred only once across the input external interfaces 208 and each produced data value is transferred only once across the output external interfaces 210, per invocation of the hardware engine 104. In one embodiment, the order that consumed data values are transferred across each input external interface 208 may be determined by the HLL specification of the software procedure implemented by hardware 200 as discussed below.

The data values consumed by the hardware engine 104 may include any parameters of the software procedure that are passed by value or passed by reference. The data values produced by the hardware engine 104 may include any parameters of the software procedure that are passed by reference and any return values for the software procedure. The consumed data values and the produced data values may include state variables, such as global variables referenced by the software procedure or static local variables of the procedure.

In one embodiment, the data values consumed by the hardware engine 104 are the parameters passed by value or reference, the global variables referenced, and the static local variables; and the data values produced by the hardware engine 104 are the parameters passed by reference, the global variables referenced, and the static local variables. In certain embodiments, some of the above consumed data values or produced data values may be eliminated from the set of data communicated via the generated hardware interface 202 by a detailed analysis of the data accesses in the HLL specification of the software procedure as discussed in detail in connection with FIG. 6. It will be appreciated that parameters passed by reference may be explicitly supported by the HLL, or that parameters passed by reference may be supported by the HLL permitting the address of a variable to be passed by value, with this address being de-referenced within the software procedure to access the variable.

In one embodiment, the order that consumed data values are transferred across an input external interface 208 may be determined from the HLL specification of the software procedure that is implemented by hardware 200. For example, the order of parameters for the software procedure and the order of declaration for global variables and static local variables may determine the order for consumed data values. The order that produced data values are transferred across an output external interface 210 may similarly be determined from the HLL specification. For multiple distribution state machines 108 or multiple collection state machines 110, the order from the HLL specification may independently determine the order of data values transferred by each state machine 108 or 110.

In one embodiment, input memory 106 may have independent ports for access by the hardware engine 104 and each distribution state machine 108. In another embodiment, the hardware engine 104 and the distribution state machine 108 may share one or more access ports to the input memory 106. Input memory 106 may include separate memories for each distribution state machine 108 or each consumed data value in an alternative embodiment. Similar access arrangements may be used for the output memory 110. It will be appreciated that the input memory 106 and the output memory 110 may have differing access arrangements.

On completion of data processing the hardware engine 104 generates the done signal on line 122 as previously discussed. In certain embodiments, a hardware interface, such as hardware interface 202, may provide the done signal on line 122 as an external signal as illustrated by dotted line 216. An external processor may use the external done signal on dotted line 216 as an interrupt input. To determine the availability at interface 218 of data values produced by the hardware engine 104, the external processor may use the interrupt instead of repeatedly polling the exists signal on line 218.

Figure 3:
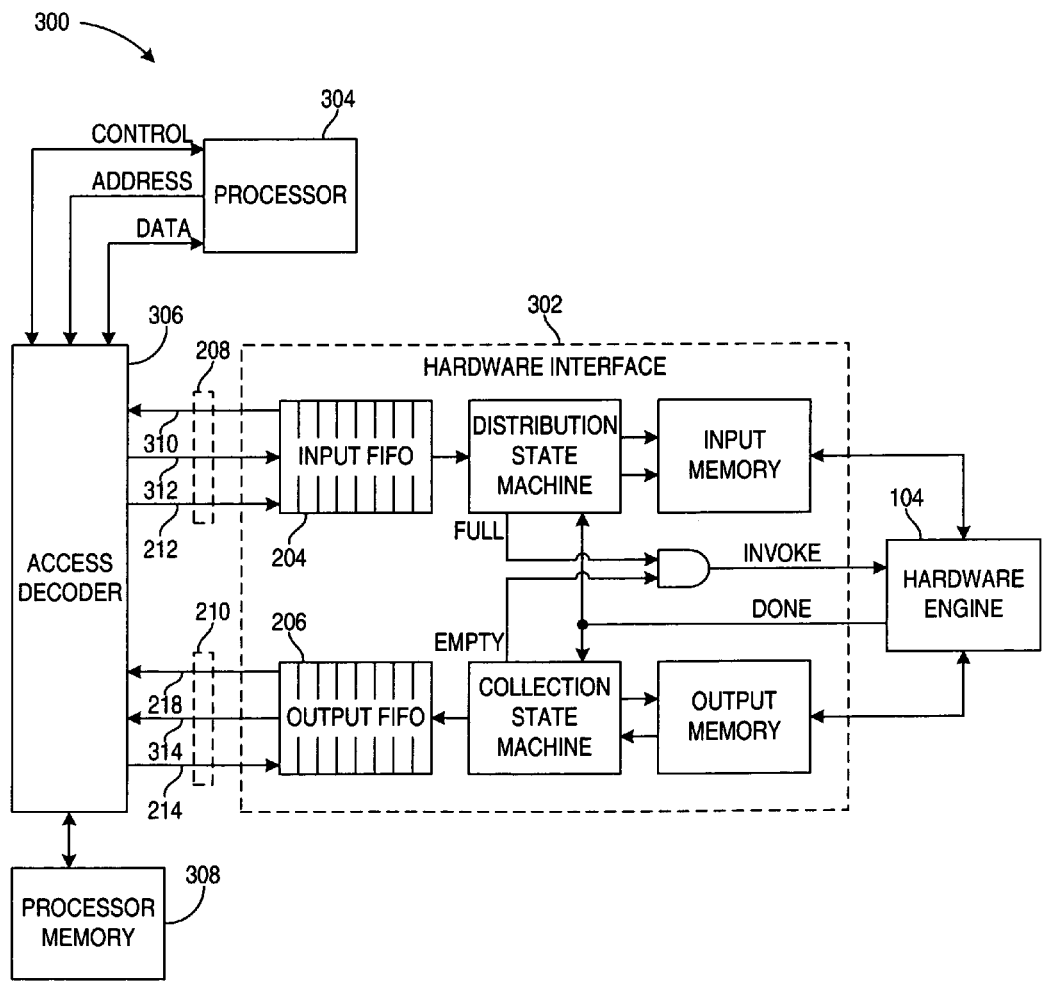
FIG. 3 is a block diagram of an example system including a hardware implementation of a software procedure, according to various embodiments of the invention.

FIG. 3 is a block diagram of an example system 300 including a hardware implementation of a software procedure, according to various embodiments of the invention. The hardware implementation of the software procedure includes hardware interface 302 and hardware engine 104.

The input FIFO 204 and the output FIFO 206 of hardware interface 302 are mapped into an address space of processor 304 by access decoder 306. The processor 304 may perform a data access to the FIFO buffers 204 and 206 or the processor memory 308 depending on the address of the access and the mapping performed by access decoder 306. In an alternative embodiment, the functionality of address decoder 306 may be incorporated into the design of the instruction set of processor 304 such that custom instructions may be provided that allow the software running on processor 304 to access dedicated communication channels 208 and 210 from the processor to the hardware interface 302 without using accesses across the system bus. One such example of this type of interface is the fast simplex link (FSL) interface of the Xilinx MicroBlaze soft processor.

A read to a particular address may allow processor 304 to obtain the current value of the full signal on line 310 for input FIFO 204. A write to a particular address may allow processor 304 to provide data to the data-in bus on line 312 while asserting the write signal on line 212 for one clock cycle. A read to a particular address may allow processor 304 to obtain the current value of the signal on line 218 for output FIFO 206. A read to a particular address may allow processor 304 to obtain data on the data-out bus on line 314 while asserting the read signal on line 214 for one clock cycle. In the alternative embodiment in which there are dedicated processor channels to the hardware interface 302, custom instructions in the processor 304 may encapsulate this behavior in blocking read or blocking write accesses to the channel. In this case the execution of the instruction will not complete until the channel is capable of returning a read element or sending the write element.

The software procedure implemented by hardware interface 302 and hardware engine 104 can be a procedure of a software program for a system. A procedure from the software program can be selected to be implemented in hardware for purposes such as improving the performance of the system. For example, the procedure might contain an inner loop of the software program that limits system performance and the inner loop might permit a parallel hardware implementation that reduces the execution time of the procedure. The processor 304 may execute a compiled version of the HLL specification of the software program, excluding the software procedure that is implemented by hardware 302 and 104.

The software program executed by processor 304 may be modified by replacing the software procedure implemented in hardware 302 and 104 with a stub procedure. The stub procedure may include any static variables declared in the original procedure and may transfer the data values consumed and produced by hardware engine 104 between the processor 304 and the hardware interface 302. The stub procedure may further include an input loop that polls the address for the full signal on line 310 to determine whether the next consumed data value can be transferred to input FIFO 204 by writing to the address for the data-in bus on line 312. After all consumed data values have been transferred to input FIFO 204 the stub procedure can enter an output loop that polls the address for the exists signal on line 218 to determine whether the next produced data value is available from output FIFO 206 by reading from the address for the data-out bus on line 314. After all produced data values have been obtained by the stub procedure, the stub procedure can update local static variables and global variables, and return the appropriate results to the system program.

Software tools that automatically generate the hardware engine 104 and the hardware interface 302 for a software procedure may additionally automatically generate the stub procedure that replaces the software procedure in the software program.

Programmable logic devices (PLD) readily allow the combination of a processor 304 and configured logic to implement a hardware interface 302 and a hardware engine 104. The processor 304 may be implemented in the configured logic of a PLD or in dedicated logic of the PLD that is external to the configured logic of the PLD. While a PLD provides an exemplary vehicle for implementing a procedure of a software program in hardware, it will be appreciated that other embodiments of the invention may be implemented on an application specific integrated circuit (ASIC) or on a multi-chip system integrating a DSP or other custom processor with an ASIC or PLD.

System 300 provides an example of a single hardware engine 104 interfacing with a processor 304. It will be appreciated that processor 304 may also interface with a hardware interface 102 of FIG. 1 that does not include FIFO buffers 204 and 206. It will be appreciated that multiple procedures can be selected for implementation in hardware with independent hardware interfaces and corresponding hardware engines. A first procedure may produce data values that are consumed in their entirety by a second procedure, and both procedures may be selected for implementation in hardware. It will appreciated that the output interface of the first procedure, such as output external interface 210, may be directly connected to the input interface of the second procedure, such as input external interface 123 of FIG. 1.

Figure 4:
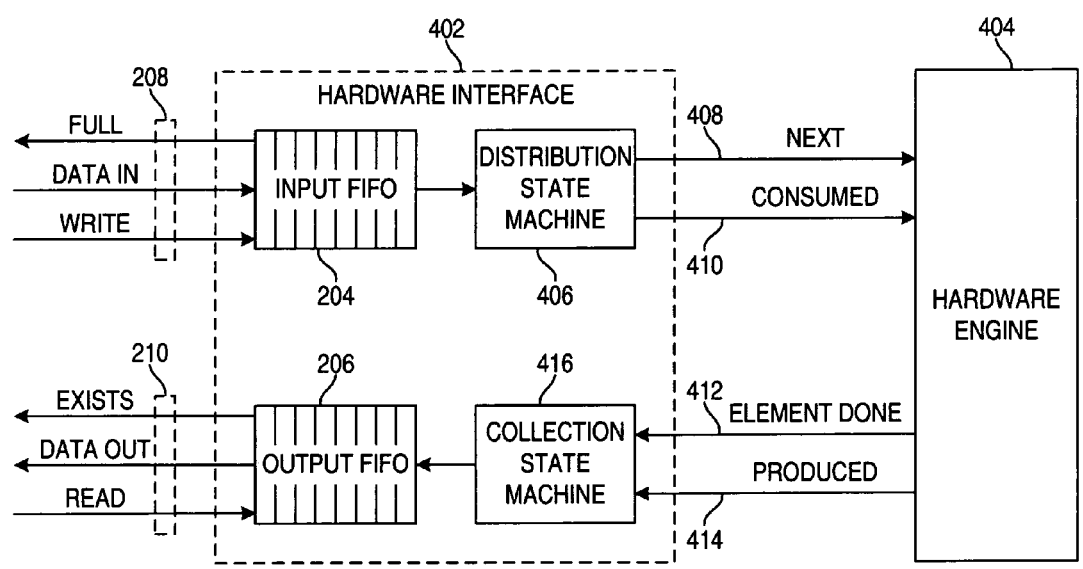
FIG. 4 is a block diagram illustrating an example hardware interface for a hardware implementation of a software procedure with pipelined data processing, according to various embodiments of the invention.

FIG. 4 is a block diagram illustrating an example hardware interface 402 for a hardware implementation of a software procedure with pipelined data processing, according to various embodiments of the invention. The data processing for the software procedure is implemented by hardware engine 404. The software procedure has an HLL specification that permits data processing in a pipelined manner by hardware engine 404.

Certain software procedures may sequentially consume each data value in a particular ordering of the consumed data values. Additionally, certain software procedures may sequentially produce each data value in a particular ordering of the produced data values. It will be appreciated that these cases may include the special cases of consuming only one data value or producing only one data value. The HLL specification may be analyzed to determine whether the data processing of the software procedure is pipelined, and to determine the consumption order and the production order when the data processing is pipelined. It will be appreciated that consumption can be pipelined without production being pipelined, and vice versa.

The order that consumed data values are transferred via input external interface 208 to input FIFO 204 can be selected to match the consumption order. Similarly, the order that produced data values are transferred via output external interface 210 from output FIFO 206 can be selected to match the production order. The decoupling of the ordering of data values previously provided by an input memory and an output memory is no longer needed, and thus these memories are eliminated from hardware interface 402.

In one embodiment, distribution state machine 406 may generate a next signal on line 408 indicating the next consumed data element is available on consumed data bus on line 410, and the hardware engine 404 may generate an element done signal on line 412 indicating the next produced data element is available on produced data bus on line 414. For the first data element from the consumption order, the next signal on line 408 starts an invocation of the hardware engine 404. The distribution state machine 406 and the collection state machine 416 may convert each data value that requires multiple transfers on external interfaces 208 and 210 into a single transfer on consumed data bus 410 and produced data bus 414, respectively.

Under certain conditions, overflow of the output FIFO 206 may not be possible, such that the collection state machine 416 does not need to flow control produced data values from the hardware engine 404. For example, the output FIFO 206 may have sufficient storage for the produced data values for an invocation of the hardware engine 404, and consumed data values for a subsequent invocation are not loaded into input FIFO 204 until after the produced data values are unloaded from the output FIFO 206. The hardware engine 404 may be continuously ready to process a consumed data value from the distribution state machine 406, such that the hardware engine 404 does not need to flow control consumed data values from the distribution state machine 406.

In another embodiment, additional handshake signals are provided allowing the hardware engine 404 to control the flow of consumed data values from the distribution state machine 406 and the collection state machine 416 to control the flow of produced data values from the hardware engine 404.

In an embodiment for an example hardware engine, the example hardware engine sequentially produces data values in a production order, but the example hardware engine does not sequentially consume data values. The corresponding hardware interface may have an input FIFO, distribution state machine, and input memory similar to input FIFO 204, distribution state machine 108, and input memory 106 of FIG. 2. The corresponding hardware interface may omit an output memory and have an output FIFO and collection state machine similar to output FIFO 206 and collection state machine 416 of FIG. 4. Referring to FIG. 2, because flow control may not be needed on the output side, the invoke signal on line 120 may be an AND function of only the full signals on lines 114 in the embodiment of the example hardware engine.

Figure 5:
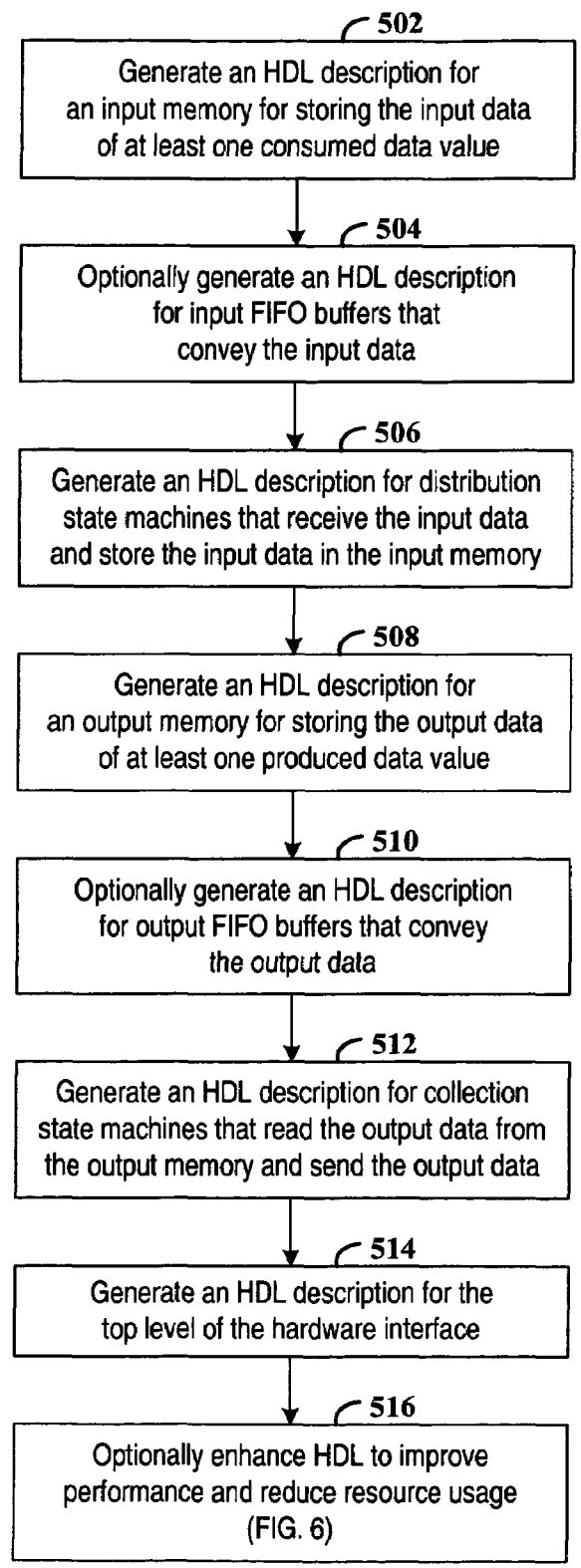
FIG. 5 is a flow diagram for a process for generating a hardware interface from a software procedure selected for a hardware implementation, according to one or more embodiments of the invention.

FIG. 5 is a flow diagram for a process for generating a hardware interface from a software procedure selected for a hardware implementation, according to one or more embodiments of the invention. The software procedure is specified in an HLL and an analysis of the software procedure may generate the hardware interface and a hardware engine that together provide the hardware implementation of the software procedure.

At step 502, a specification for an input memory is generated in an HDL, such as Verilog or VHDL. The input memory is specified to contain storage for each data value consumed by the hardware engine. The input memory is specified with a particular width that may match the width of the largest consumed data value that is not a data structure or an array. Alternatively, the width may be selected to meet performance objectives, such as throughput, while satisfying resource limitations, such as available wiring channels.

Each consumed data value is assigned respective locations in the input memory with each consumed data value that is wider than the input memory being assigned multiple sequential locations in the input memory. The input memory may be implemented as multiple parallel memories with each consumed data value assigned to one of the parallel memories, for example, each consumed data value may be assigned to a separate memory.

The input memory may be omitted from the hardware interface following certain enhancements to the hardware interface as later discussed in detail in connection with FIG. 6.

At step 504, a specification in an HDL of one or more input FIFO buffers is optionally generated. The input FIFO buffers are included or omitted depending upon whether a passive or an active external interface is desired for the hardware interface. The number of input FIFO buffers and the width and depth of each input FIFO may be selected to meet performance objectives and resource limitations. Each consumed data value is assigned to one of the input FIFO buffers.

At step 506, a specification in an HDL of each distribution state machine is generated. The hardware interface includes a respective distribution state machine for each input channel (lines 123 or 208). Each distribution state machine distributes consumed data values from the corresponding input channel to the assigned locations in the input memory. Because the width of an input channel may not match the width of the input memory, each distribution state machine may also provide segmentation or assembly of each consumed data value.

The consumed data values are received by a distribution state machine in a particular order. Each distribution state machine tracks the progress in receiving the consumed data values that are assigned to the distribution state machine. Progress tracking may include counting the consumed data values and counting the number of transfers from the input channel for each consumed data value. After the consumed data values for an invocation of the hardware engine are received, each distribution state machine may generate a full output to indicate availability in the input memory of the consumed data values that are assigned to the distribution state machine.

At step 508, a specification for an output memory is generated in an HDL in a manner similar to the input memory at step 502. The output memory is specified to contain storage for each data value produced by the hardware engine. Each produced data value is assigned respective locations in the output memory with each produced data value that is wider than the output memory being assigned multiple sequential locations in the output memory. The output memory may be implemented as multiple parallel memories with each produced data value assigned to one of the parallel memories.

The output memory may be omitted from the hardware interface following certain enhancements to the hardware interface as discussed in detail in connection with FIG. 6.

At step 510, a specification in an HDL of one or more output FIFO buffers is optionally generated in a manner similar to the input FIFO buffers at step 504. Each produced data value is assigned to one of the output FIFO buffers.

At step 512, a specification in an HDL of each collection state machine is generated. The hardware interface includes a respective collection state machine for each output channel (lines 133 and 210). Each collection state machine collects the produced data values that are assigned to the collection state machine from the assigned locations in the output memory, and delivers these produced data values to the corresponding output channel. Because the width of the output memory may not match the width of an output channel, each collection state machine may also provide segmentation or assembly of each produced data value.

The produced data values are delivered by a collection state machine to a corresponding output channel in a particular order. Each collection state machine tracks the progress in delivering the produced data values that are assigned to the collection state machine. Progress tracking may include counting the produced data values and counting the number of transfers to the output channel for each produced data value. After the produced data values that are assigned to a collection state machine have been delivered to the corresponding output channel for an invocation of the hardware engine, the collection state machine may generate an empty output. The empty output indicates the output memory can accept the produced data values that are assigned to the collection state machine for a subsequent invocation of the hardware engine.

At step 514, a specification in an HDL of the hardware interface is generated and may include instantiations and associated connections for one or more input FIFO buffers, one or more input channels, an input memory, a number of distribution state machines corresponding to the number of input FIFO buffers, one or more output FIFO buffers, one or more output channels, an output memory, and a number of collection state machine corresponding to the number of output FIFO buffers. The hardware interface may couple an invoke signal to a next signal generated by a distribution state machine, or the invoke signal may be generated by an AND function included in the hardware interface. Respective full signals from each distribution state machine and respective empty signals, if provided, from each collection state machine may be used by the AND function to generate the invoke signal.

The specification of the hardware interface may include ports to communicate with the hardware engine and external communication ports. The ports to communicate with the hardware engine may include communication of consumed and produced data values and control signals to invoke and indicate completion of data processing or a step of the data processing by the hardware engine. The external communication ports may include one or more ports for communicating consumed data values and one or more ports for communicating produced data values. The external communication port may optionally include a control signal to indicate the completion of an invocation of the hardware engine.

At step 516, the generated HDL specification for the hardware interface may be enhanced as discussed below.

Figure 6:
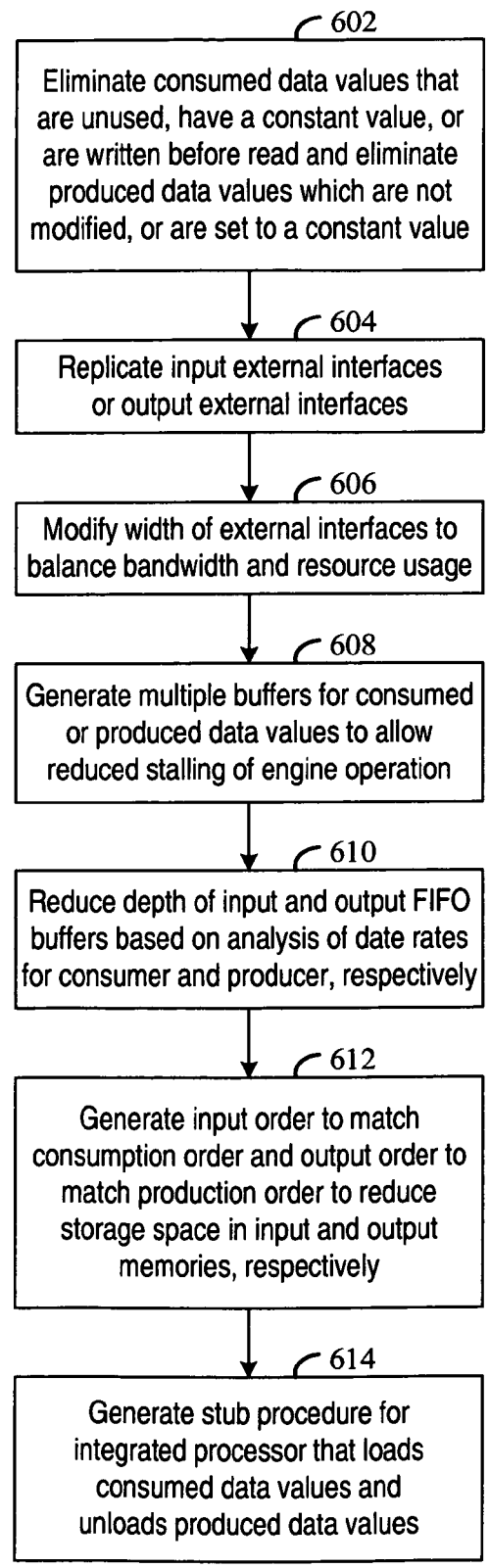
FIG. 6 is a flow diagram for a process to enhance a hardware interface that is generated from a software procedure, according to one or more embodiments of the invention.

FIG. 6 is a flow diagram for a process to enhance a hardware interface that is generated from a software procedure, according to one or more embodiments of the invention. A detailed analysis of the HLL specification of the software procedure may determine particular characteristics of the software procedure that may be exploited to enhance the hardware interface for the software procedure.

At step 602, an analysis of the data processing operations by the software procedure is used to reduce the amount of consumed and produced data values that are transferred by the hardware interface.

The consumed data values may be restricted to a subset of the input parameters, which may include software procedure parameters passed by value or reference, and global or static local variables referenced by the software procedure. The consumed data values may be restricted to input parameters that have a value read by the software procedure. The consumed data values may be further restricted to input parameters that have a value read by the software procedure without a prior write by the software procedure. The consumed data values may also be restricted to input parameters that do not have a constant value.

The produced data values may be restricted to a subset of the output parameters, which may include software procedure parameters passed by reference, global or static local variables referenced by the software procedure, and return values of the software procedure. The produced data values may be restricted to output parameters that have a value written by the software procedure. The produced data values may be further restricted to output parameters that have a value, which is not a constant value, written by the software procedure.

In addition, only parameter references by reachable statements of the software procedure could be considered to determine consumed and produced data values. For a parameter reference to a portion of a parameter, the consumed or produced data values may include only the referenced portion of the parameter. For example, a software procedure may add the sum of entries two and four to entry seven of an array passed by reference. The consumed data values are the initial values of entries two, four, and seven of the array and the produced data value is the calculated value for entry seven of the array.

The removal of consumed data values or produced data values from the hardware interface is accomplished by modification of the state machine(s) to which those data values were assigned, reducing the total number of elements expected by that state machine and accounting for the missing value when generating the address(es) into the corresponding input or output memory. The removal of the data values is also reflected in any stub procedure generated which will run on the coupled processor and which is responsible for sending data to and receiving data from the generated hardware interface. Similarly, if the hardware interface is directly coupled to another hardware interface, the removal of one or more data values is also reflected in the coupled hardware interface.

At step 604, performance may be enhanced by replication of input and output external interfaces. Increasing the number of input external interfaces for consumed data values may increase the input bandwidth of the hardware interface and increasing the number of output external interfaces for produced data values may increase the output bandwidth of the hardware interface. Each consumed data value is assigned to one of the input external interfaces and each produced data value is assigned to one the output external interfaces.

At step 606, the width of the input external interface and output external interfaces may be modified to achieve performance objectives or satisfy resource limitations. Increasing the width of an external interface may increase the bandwidth and throughput capabilities of the hardware interface while also increasing the number of wiring channels used.

At step 608, the decoupling between the hardware engine and the external interface may be increased by increasing the storage in the hardware interface for consumed and produced data values. Increased decoupling reduces the likelihood that the hardware engine becomes stalled waiting for either consumed data values or free storage for produced data values. Storage may be increased such that consumed or produced data values for multiple invocations of the hardware engine may be stored in the hardware interface. The increased storage may be in one or more of the input FIFO, the output FIFO, the input memory, or the output memory.

At step 610, the data transfer rates may be determined for the hardware engine and the external interfaces. The depth of the input and output FIFO buffers may be set to provide the desired level of decoupling based on data transfer rates of the external interfaces and the hardware engine and the degree of contention at the external interfaces. Data transfer rates are determined via analysis of the generated hardware engine to determine the average data consumption and production rates in terms of number of values consumed/produced per clock cycle. Similarly, the source and sink of the data, external to the hardware engine, are analyzed for their ability to produce or consume data on a per clock cycle basis. These relative rates can then be used in the determination of the required FIFO buffer depth.

At step 612, an analysis of the software procedure may determine that each consumed data value is referenced in a particular consumption order. By receiving data at the input external interface in the consumption order, the input memory may be eliminated from the hardware interface as previously discussed in connection with FIG. 4. In addition, an analysis of the software procedure may determine that each produced data value is referenced in a particular production order. By transmitting data at the output external interface in the production order, the output memory may similarly be eliminated from the hardware interface.

At step 614, the software procedure may be replaced by a stub procedure that interacts with the hardware interface by loading consumed data values and unloading produced data values, as previously discussed in connection with FIG. 3.

Those skilled in the art will appreciate that various alternative computing arrangements, including one or more processors and a memory arrangement configured with program code, would be suitable for hosting the processes of the different embodiments of the present invention. In addition, the processes may be provided via a variety of computer-readable media or delivery channels such as magnetic or optical disks or tapes, electronic storage devices, or as application services over a network.

The present invention is believed to be applicable to a variety of systems for generating a hardware interface for a software procedure. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for generating a hardware interface specification in a hardware description language (HDL) from a high-level language (HLL) specification of a software procedure, comprising:

generating an HDL description of a first memory for storing input data corresponding to a plurality of data values consumed by the software procedure specified by the HLL specification;

generating an HDL description of at least one first state machine that receives the input data and stores the input data in the first memory, wherein at least one of the at least one first state machine receives a plurality of the data values;

generating for each first state machine an HDL description of a respective first FIFO buffer that conveys the input data to the first state machine, wherein the input data is read from the respective FIFO buffer to the first state machine and stored in the first memory;

generating an HDL description of a second memory for storing output data corresponding to at least one data value produced by the software procedure specified by the HLL specification;

wherein the input data in the first memory is consumed and the output data in the second memory is produced by a hardware implementation of data processing performed by the software procedure;

generating an HDL description of at least one second state machine that reads the output data from the second memory and sends the output data;

generating for each second state machine an HDL description of a respective second FIFO buffer that conveys the output data from the second state machine; and generating an HDL description of an activation signal that is activated in response to a corresponding at least one first signal from the at least one first state machine, wherein the at least one first signal indicates availability of the input data in the first memory.

2. The method of claim 1, further comprising generating an HDL description for the hardware interface specification including inputs to receive the input data and outputs to send the output data.

3. The method of claim 1, wherein the activation signal is activated in response to the corresponding at least one first signal and a corresponding at least one second signal from the at least one second state machine, wherein the at least one second signal indicates availability of storage for the output data in the second memory.

4. The method of claim 1, further including generating a stub procedure from the software procedure, wherein executing the stub procedure sends the input data to the hardware interface and receives the output data from the hardware interface.

5. The method of claim 1, wherein the data values consumed by the software procedure include parameters of the software procedure passed by value, parameters of the software procedure passed by reference, global variables that are referenced by the software procedure, and static local variables of the software procedure.

6. The method of claim 5, wherein the data values consumed by the software procedure are read by the software procedure.

7. The method of claim 6, wherein the data values consumed by the software procedure are first read by the software procedure without a prior write by the software procedure.

8. The method of claim 7, wherein the data values consumed by the software procedure have non-constant values.

9. The method of claim 1, wherein the data values produced by the software procedure include parameters of the software procedure passed by reference, global variables that are referenced by the software procedure, static local variables of the software procedure, and return values of the procedure.

10. The method of claim 9, wherein the data values produced by the software procedure are written by the software procedure.

11. The method of claim 10, wherein the data values produced by the software procedure have non-constant values.

12. The method of claim 1, wherein a number of the at least one first state machine and a width of the respective first FIFO buffer are selected according to a bandwidth objective for the receiving of the input data, and a number of the at least one second-state machine and a width of the respective second FIFO buffer are selected according to a bandwidth objective for the sending of the output data.

13. The method of claim 1, wherein the depth of the first FIFO buffer is selected according to a decoupling objective for the receiving of the input data, and the depth of the second FIFO buffer is selected according to a decoupling objective for the sending of the output data.

14. The method of claim 1, wherein an input order for the input data matches a consumption order for the data values consumed by the software procedure and the HDL description of the first memory is not included in the HDL description of the hardware interface specification.

15. The method of claim 1, wherein the first memory includes a plurality of buffers for storing the input data.

16. The method of claim 1, wherein an output order for the output data matches a production order for the data values produced by the software procedure and the HDL description of the second memory is not included in the HDL description of the hardware interface specification.

17. An apparatus for generating a hardware interface specification in a hardware description language (HDL) from a high-level language (HLL) specification of a software procedure, comprising:
means for generating an HDL description of a first memory for storing input data corresponding to a plurality of data values consumed by the software procedure as specified by the HLL description;
means for generating an HDL description of at least one first state machine that receives the input data and stores the input data in the first memory, wherein at least one of the at least one first state machine receives a plurality of the data values;
means for generating for each first state machine an HDL description of a respective first FIFO buffer that conveys the input data to the first state machine, wherein the input data is read from the respective FIFO buffer to the first state machine and stored in the first memory;
means for generating an HDL description of a second memory for storing output data corresponding to at least one data value produced by the software procedure as specified by the HLL description;
wherein the input data in the first memory is consumed and the output data in the second memory is produced by a hardware implementation of data processing performed by the software procedure;
means for generating an HDL description of at least one second state machine that reads the output data from the second memory and sends the output data;
means for generating for each second state machine an HDL description of a respective second FIFO buffer that conveys the output data from the second state machine; and
means for generating an HDL description of an activation signal that is activated in response to a corresponding at least one first signal from the at least one first state machine, wherein the at least one first signal indicates availability of the input data in the first memory.

18. A hardware interface, which is derived from a high-level language (HLL) specification of a software procedure, for a hardware implementation of the software procedure, comprising:
an input memory adapted to buffer input data corresponding to a plurality of data values consumed by the software procedure as specified by the HLL description;
a distribution state machine coupled to the input memory and adapted to receive the input data, store the input data in the input memory, and to generate a first signal indicating availability of the input data in the input memory;
an input FIFO buffer coupled to the distribution state machine and adapted to send the input data to the distribution state machine; and
an output memory adapted to buffer output data corresponding to at least one data value produced by the software procedure as specified by the HLL description;
wherein the input data in the first memory is consumed and the output data in the second memory is produced by a hardware implementation of data processing performed by the software procedure;
a collection state machine coupled to the output memory and adapted to read the output data from the output memory and send the output data;

an output FIFO buffer coupled to the collection state machine and adapted to receive the output data from the collection state machine; and an activation signal arranged to activate, in response to the first signal, a hardware engine adapted to read the input data from the input memory, perform data processing in accordance with the software procedure, and write the output data to the output memory.

19. The hardware interface of claim 18, wherein the collection state machine is further adapted to generate a second signal indicating availability of storage for the output data in the output memory and the activation signal is arranged to activate the hardware engine in response to the first signal and the second signal.

* * * * *